United States Patent
Yang

(10) Patent No.: US 7,501,895 B2
(45) Date of Patent: Mar. 10, 2009

(54) CHANNEL STATE AIDED AUTOMATIC GAIN CONTROL

(75) Inventor: Xueshi Yang, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 355 days.

(21) Appl. No.: 11/450,076

(22) Filed: Jun. 9, 2006

(65) Prior Publication Data

US 2007/0296500 A1 Dec. 27, 2007

(51) Int. Cl.
*H03G 3/10* (2006.01)
(52) U.S. Cl. .................................. 330/279; 330/278
(58) Field of Classification Search ................. 330/278, 330/279, 282, 290
See application file for complete search history.

(56) References Cited

U.S. PATENT DOCUMENTS

| | | |
|---|---|---|
| 3,392,370 A | 7/1968 | Neitzel |
| 3,710,352 A * | 1/1973 | Smith et al. .................. 365/117 |
| 5,220,468 A | 6/1993 | Sidman |
| 5,228,063 A | 7/1993 | Zucker |
| 5,631,891 A | 5/1997 | Moritsugu et al. |
| 5,831,888 A | 11/1998 | Glover |
| 6,671,266 B1 * | 12/2003 | Moon et al. .................. 370/342 |
| 6,766,153 B2 * | 7/2004 | Kozak et al. ............. 455/232.1 |
| 2002/0061738 A1 | 5/2002 | Simmons et al. |
| 2002/0187765 A1 | 12/2002 | Kozak et al. |
| 2003/0032402 A1 | 2/2003 | Asano |
| 2003/0053236 A1 | 3/2003 | Loh et al. |
| 2004/0097209 A1 | 5/2004 | Haub et al. |
| 2004/0102168 A1 | 5/2004 | Ahn et al. |

OTHER PUBLICATIONS

J. W. M. Bergmans, "Digital Baseband Transmission and Recording," Kluwer Academic Publishers, Dordrecht, The Netherlands, 1996, pp. 382-395.

* cited by examiner

*Primary Examiner*—Henry K Choe
(74) *Attorney, Agent, or Firm*—Robert P. Lenart, Esq.; Pietragallo Gordon Alfano Bosick & Raspanti, LLP

(57) ABSTRACT

An apparatus comprises a circuit for producing a channel gain control signal, and an amplifier for amplifying a signal of interest in response to the channel gain control signal, wherein the channel gain control signal is generated from a channel state signal that is not derived from the signal of interest.

16 Claims, 12 Drawing Sheets

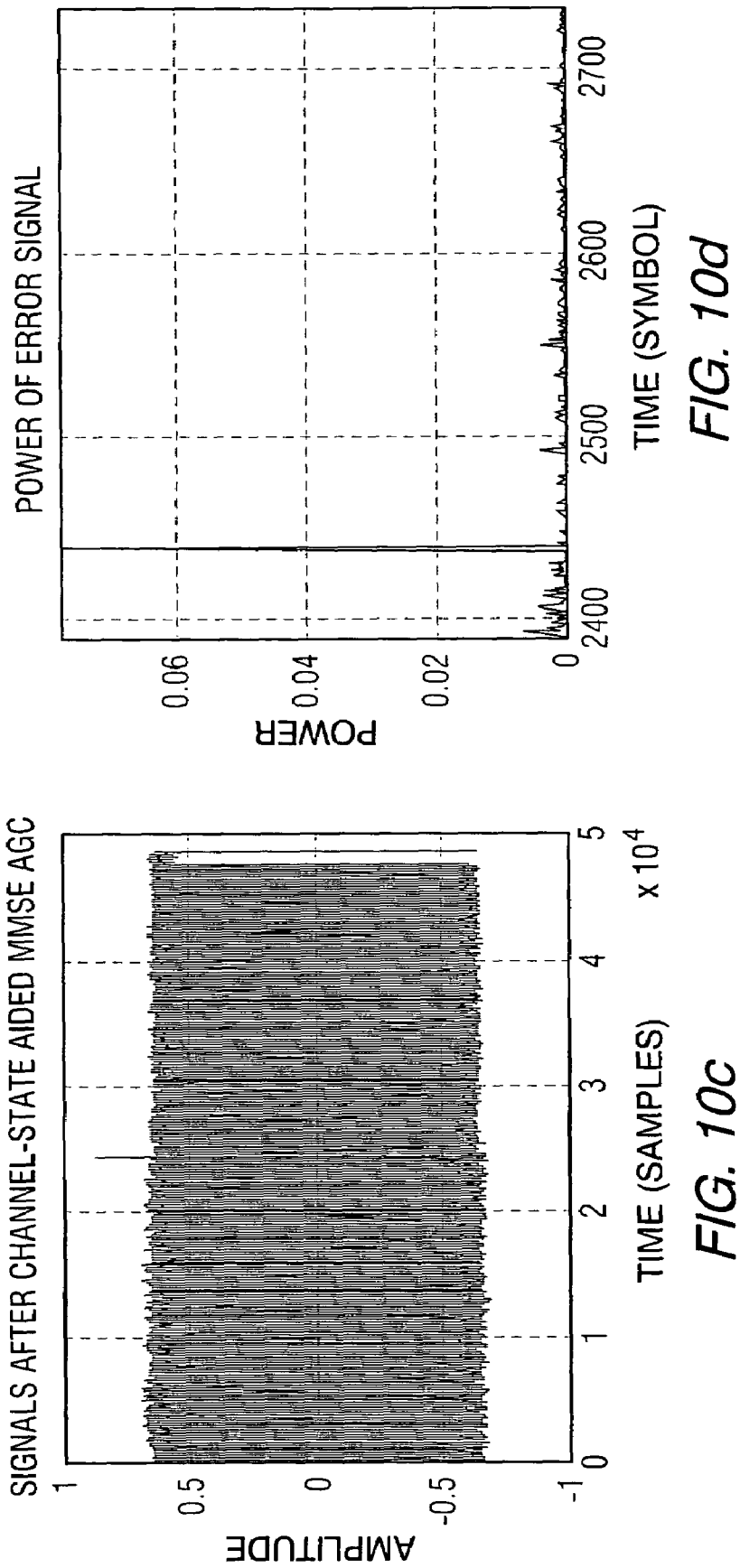

CHANNEL STATE AIDED AUTOMATIC GAIN CONTROL

FIELD OF INVENTION

This relates to an automatic gain control (AGC) for a channel receiver, and more particularly to an AGC that utilizes a priori channel state information.

BACKGROUND OF THE INVENTION

In many communication systems, the received signal amplitude varies widely. For example, in magnetic recording channels, replay signal levels may vary by more than 20 dB due to the combined properties of the heads, media and preamplifiers. In such cases, automatic gain control (AGC) is ubiquitously employed to limit the signal variation. Signal levels after AGC become more consistent with a much smaller dynamic range, which facilitates further signal processing.

There are primarily two different approaches for automatic gain control; either non-data-aided (NDA) or data-aided (DA), depending on whether decisions on the transmitted symbols are exploited. Typically, data-aided AGCs are more efficient than non-data-aided AGCs, and hence data-aided AGCs are more often employed in modem communication systems.

While many types of AGCs are known, there remains a need for an automatic gain control that can take advantage of the particular characteristics of data storage systems to provide improved performance.

SUMMARY OF THE INVENTION

This invention provides an apparatus comprising a circuit for producing a channel gain control signal, and an amplifier for amplifying a signal of interest in response to the channel gain control signal, wherein the channel gain control signal is generated from a channel state signal that is not derived from the signal of interest.

In another aspect, the invention provides a method comprising: producing a channel gain control signal, and amplifying a signal of interest in response to the channel gain control signal, wherein the channel gain control signal is generated from a channel state signal that is not derived from the signal of interest.

This invention also encompasses a first circuit for producing a loop gain signal, a second circuit for producing a channel gain signal, and an apparatus comprising an amplifier for amplifying a signal of interest in response to a gain control signal, wherein the gain control signal comprises a combination of the loop gain signal and the channel gain signal.

In another aspect, the invention provides a method comprising: producing a loop gain signal, producing a channel gain signal, and amplifying a signal of interest in response to a gain control signal, wherein the gain control signal comprises a combination of the loop gain signal and the channel gain signal.

In yet another aspect, the invention provides an apparatus comprising a ferroelectric storage medium, an array of probes for reading data from the ferroelectric storage medium, a first circuit for producing a loop gain signal, a second circuit for producing a channel gain signal, and an amplifier for amplifying a read signal from the probes in response to a gain control signal, wherein the gain control signal comprises a combination of the loop gain signal and the channel gain signal.

BRIEF DESCRIPTION OF THE DRAWINGS

FIGS. 10a, 10b, 10c and 10d show simulation results for a channel state aided MMSE AGC.

DETAILED DESCRIPTION OF THE INVENTION

Figure 1:
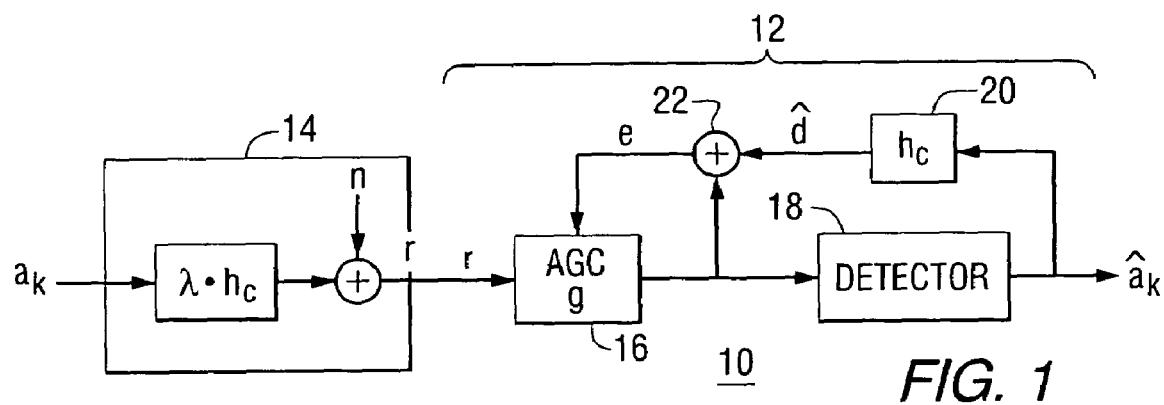
FIG. 1 is a schematic diagram of a communication system with a data-aided AGC.

Referring to the drawings, FIG. 1 is a schematic diagram of a communication system 10 with a data-aided AGC 12. The signal of interest $a_k$ is transmitted over a transmission channel 14 having a variable gain $\lambda$, a channel response $h_c$, and additive noise n. This transforms the signal of interest into a signal r that is received by a controllable amplifier circuit 16 having a gain coefficient g. A gain-controlled signal d is output by the amplifier and passed to a detector 18, which produces an estimate $\hat{a}_k$ of the signal of interest. The estimate is passed through a feedback circuit 20 having a response $h_c$ to produce an estimated ideal signal $\hat{d}$. The estimated ideal signal $\hat{d}$ and the signal d are combined in summation point 22 to produce an error signal e, which is used to control the AGC amplifier. The automatic gain control unit exploits the error signal e, which is the difference between the ideal signal $\hat{d}$ and gain-controlled signal d, to adapt the gain coefficient g of the amplifier. Ideally, the gain g should converge to $1/\lambda$ once the loop stabilizes.

Figure 2:
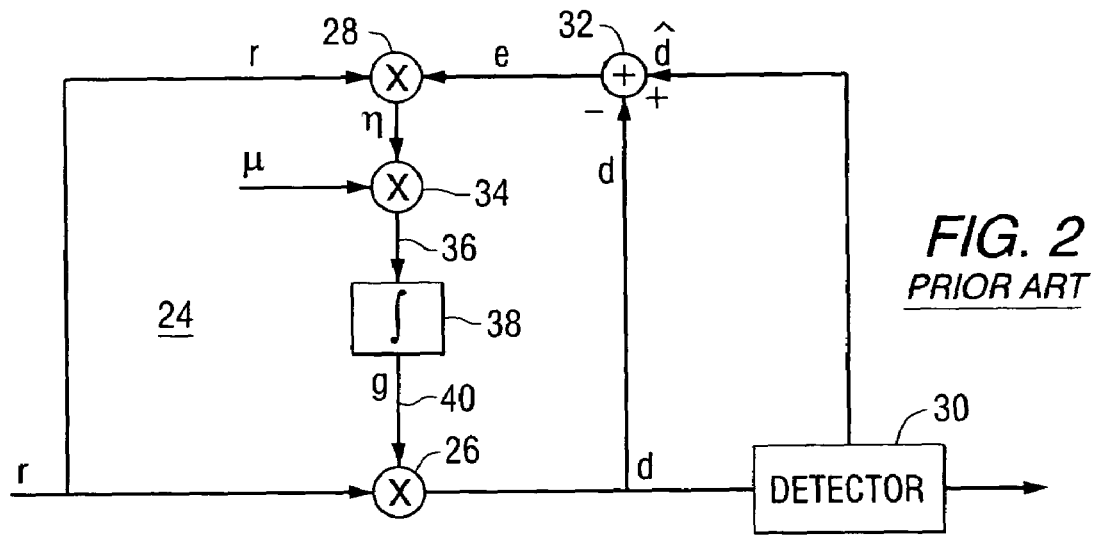
FIG. 2 is a schematic diagram of a minimum mean-square error (MMSE) process for a data-aided AGC.

FIG. 2 is a schematic diagram of a prior art minimum mean-square error (MMSE) data-aided AGC 24. A received signal r is input to multipliers 26 and 28. The output of multiplier 26 is the gain-controlled signal d. This signal is passed to a detector and feedback circuit 30, which produces the estimated ideal signal $\hat{d}$. The estimated ideal signal $\hat{d}$ and the gain-controlled signal d are combined in summation point 32 to produce an error signal e. The error signal e is multiplied by the received signal r to produce an intermediate variable η. This variable η is multiplied by an adaptation constant μ in multiplier 34 to produce a signal on line 36 that is integrated as shown in block 38 to produce a gain coefficient g on line 40 that is multiplied by the received signal by multiplier 26. The loop properties can be controlled by the adaptation constant μ, and its value is determined by the desired loop behavior, as described below.

The principle of the MMSE AGC is to adapt the gain coefficient g such that the mean-square error $E\{e^2\}$ is minimized. Adaptation can be accomplished via a gradient descent (also known as steepest descent) algorithm. Gradient descent is an optimization algorithm that approaches a local minimum (or local maximum) of a function by taking steps proportional to the negative gradient (or gradient, if maximum is desired) of the function at the current point. In practice, the gradient is often estimated by an instant computed value, which is referred to as the least mean-square (LMS) algorithm. The step size is determined by an adaptation parameter μ, which may vary during the adaptation process. The parameter μ is chosen small enough to ensure convergence of the iterative procedure. Using the LMS algorithm, the gain coefficient g at time k, denoted by $g_k$, can be computed as $$g_k = g_{k-1} + \mu r \cdot e, \quad (1)$$

where μ is the adaptation step size, a small positive number.

Throughout this description, the amplifiers are assumed to be linear variable gain amplifiers, which amplify the received signal r by a factor of g. It is evident that nonlinear variable gain amplifiers would also be applicable for all the examples presented here. In particular, an exponential gain amplifier where the amplification gain is given $e^g$ is a popular choice for automatic gain control applications.

When designing a conventional data-aided AGC, such as a MMSE AGC, a careful trade-off between rate of convergence and total mean-square error $E\{e^2\}$ needs to be made. Generally speaking, a faster convergence rate (corresponding to a larger step size μ) implies a larger mean-square error; conversely a smaller mean-square error implies smaller step size, and a slower convergence. This is partially due to the fact that the AGC algorithm does not possess any a priori information on the channel, and all the gain adaptation is based on an a posteriori received signal.

In some communication systems, however, related channel information which influences the signal amplitude (or power) is available to the receiver. Such a priori channel state information can be exploited by the receiver to improve the performance of AGC. An example of a device that can provide such channel state information is a ferroelectric media based probe storage device.

Figure 3:
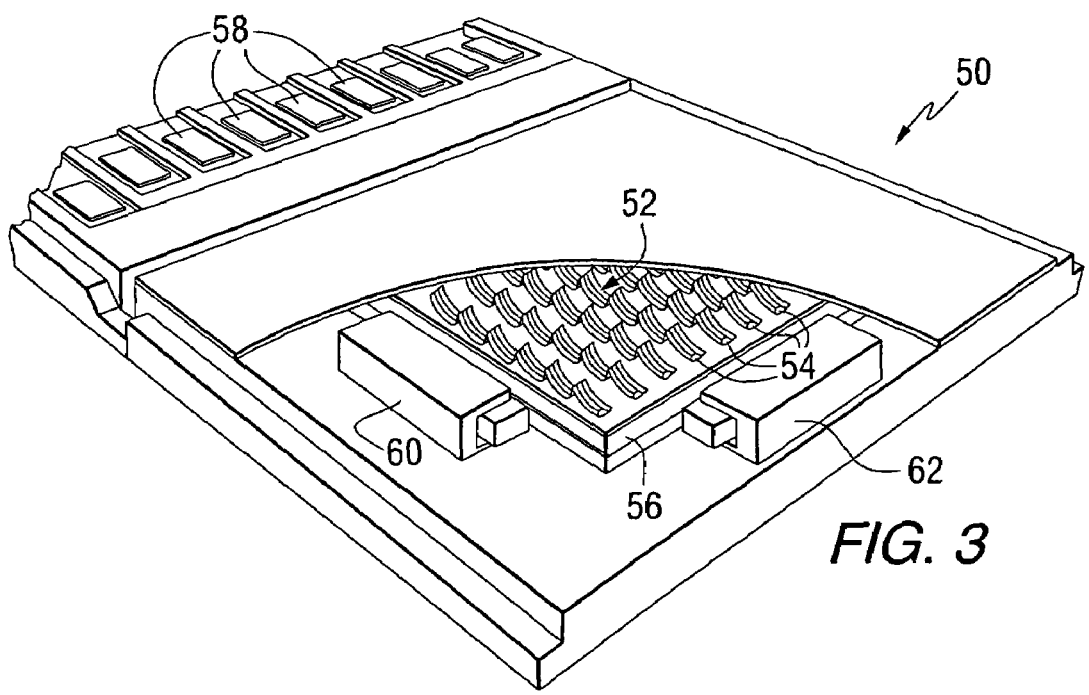
FIG. 3 is a perspective view of a probe type data storage device.

FIG. 3 is a perspective view of a ferroelectric media based probe storage device 50, which illustrates an implementation of a storage system constructed in accordance with the present invention. In the ferroelectric based probe storage device 50 of FIG. 3, an array 52 of ferroelectric heads 54 is positioned adjacent to a storage medium 56. In the configuration shown in FIG. 3, the array 54 and the medium 56 are planar and extend generally parallel with each other. The array 54 comprises a plurality of electrodes, which are operably coupled to connectors 58. The storage medium 56 is coupled to at least one actuator 60, which is configured to move the medium 56 relative to array 52. This movement causes the probe heads to be moved relative to the individual ferroelectric domains on medium 56. Each head can include one or more electrodes.

In such devices, the relative movement between the heads and the media can be obtained through embedded position sensors 62. Since the relative speed of the head and media directly affects the readback signal amplitude, the position signal becomes a priori knowledge to the receiver and can be exploited as explained below.

If any channel state information, and changes in channel state information, are reliably available to the receiver, rather than waiting for the AGC loop to track the resultant change contained in the received signal via adaptation, explicit adjustment can be made on the gain coefficient g to track the change more efficiently. On the other hand, a conventional gain control loop is likewise necessary to track other varying factors of the channel, since the available channel state information is usually noisy and incomplete.

Figure 4:
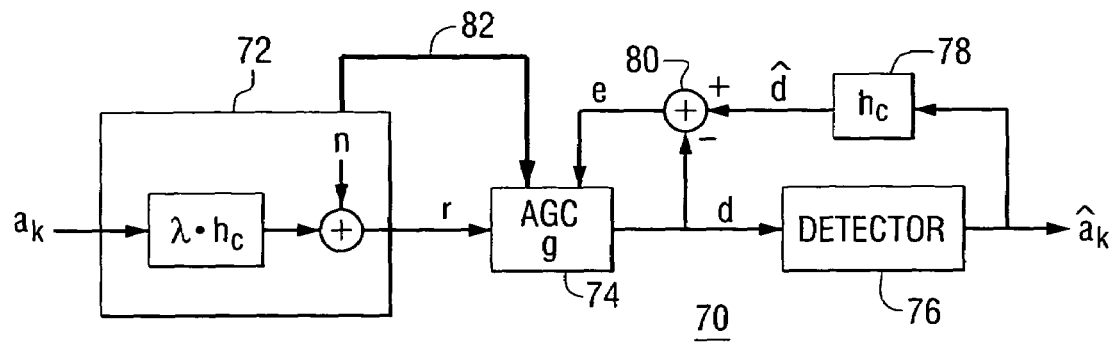
FIG. 4 is a schematic diagram illustrating a general architecture of a channel state aided automatic gain control.

FIG. 4 is a schematic diagram illustrating a general architecture of a channel state aided automatic gain control 70. The signal of interest $a_k$ is transmitted over a transmission channel 72 having a variable gain η, a channel response $h_c$, and additive noise n. This transforms the signal of interest into a signal r that is received by a controllable amplifier circuit 74 having a gain g. A gain-controlled signal d is output by the amplifier and passed to a detector 76, which produces an estimate $\hat{a}_k$ of the signal of interest. The estimate is passed through a feedback circuit 78 having a response $h_c$ to produce an estimated ideal signal d̂. The estimated ideal signal d̂ and the signal d are combined in summation point 80 to produce an error signal e, which is used to control the AGC amplifier. The automatic gain control unit exploits the error signal e, which is the difference between the ideal signal d̂ and gain-controlled signal d, to adapt the gain coefficient g. Ideally, g should converge to 1/λ once the loop stabilizes.

The architecture illustrated in FIG. 4 differs from conventional AGCs in the direct utilization of available channel state information, as illustrated by arrow 82. This channel state information is not derived from the signal of interest. Depending on the specific implementation, the channel state information can be exploited in various ways.

Figure 5:
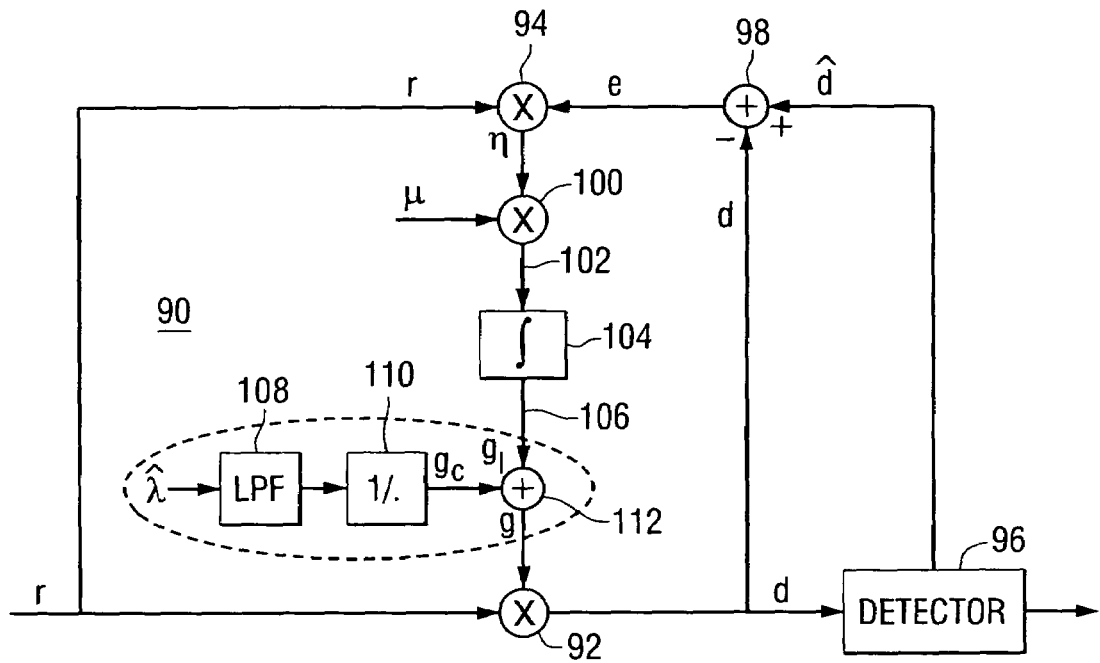
FIG. 5 is a schematic diagram of a channel state aided MMSE AGC.

FIG. 5 is a schematic diagram of an example AGC 90 of the present invention, where channel state information in the form of a channel gain observation $\hat{\lambda}$ is explicitly utilized by a MMSE based gain control circuit. A channel gain observation can be, for example, the relative speed of the head and media in a probe storage device.

A received signal r is input to multipliers 92 and 94. The output of multiplier 92 is the gain-controlled signal d. This signal is passed to a detector and feedback circuit 96, which produces the estimated ideal signal d̂. The estimated ideal signal d̂ and the signal d are combined in summation point 98 to produce an error signal e. The error signal e is multiplied by the received signal to produce a gradient estimate η, which is multiplied by an adaptation step size μ in multiplier 100 to produce a signal on line 102 that is integrated as shown in block 104 to produce a gain coefficient $g_l$ on line 106. A (possibly) noisy observation $\hat{\lambda}$ of the actual channel gain λ is filtered by a low-pass filter (LPF) 108 to reduce the noise. The filtered version of $\hat{\lambda}$ is subsequently inverted by inverter 110 to generate a gain multiplication factor $g_c$, as the desired amplifier gain should be inversely proportional to the actual channel gain.

The gain factor $g_c$ is then added to the MMSE AGC loop gain $g_l$ at summation point 112, arriving at a total gain $g = g_c + g_l$, which is used to multiply the received signal as illustrated by multiplier 92.

The circuit of FIG. 5 provides two advantages when compared to the circuit of FIG. 2. First, it provides faster acquisition when the channel state, and in particular the channel gain, fluctuates rapidly. Direct tuning of the gain g in proportion to the actual channel gain λ can significantly reduce the time for the gain loop to keep up with the channel.

Second, the circuit of FIG. 5 can have a lower mean-square error. When a majority of the channel gain variation is captured by direct adaptation of the gain g, the loop bandwidth can be set small to account for the residual amplitude variation. Specifically, for a MMSE based channel state aided AGC, the step size μ can be made small as long as the residual variation can be tracked by the closed loop. Consequently, a smaller mean-square error can be attained compared to a conventional AGC. This is equivalent to having two separate loop parameters for gain adaptation, which track a priori known (usually large) and residual unknown (usually much smaller) amplitude variations respectively.

For probe storage devices, the relative speed of the media and head is the primary contributor affecting the signal amplitude. Moreover, this information is usually available to the read channel. When the system of FIG. 1 is applied to a probe storage device, the channel gain λ is proportional to the relative speeds of the head and media, that is:

$$\lambda \propto v_k \triangleq \frac{x_k - x_{k-1}}{T} \quad (2)$$

where $x_k$ and $x_{k-1}$ are the position signals at time k and k−1 respectively; T is the interval between the k and $(k-1)^{th}$ position measurement; and $v_k$ is the relative speed measured at time k. FIG. 5 suggests a channel state aided AGC as shown in FIG. 6.

Figure 6:
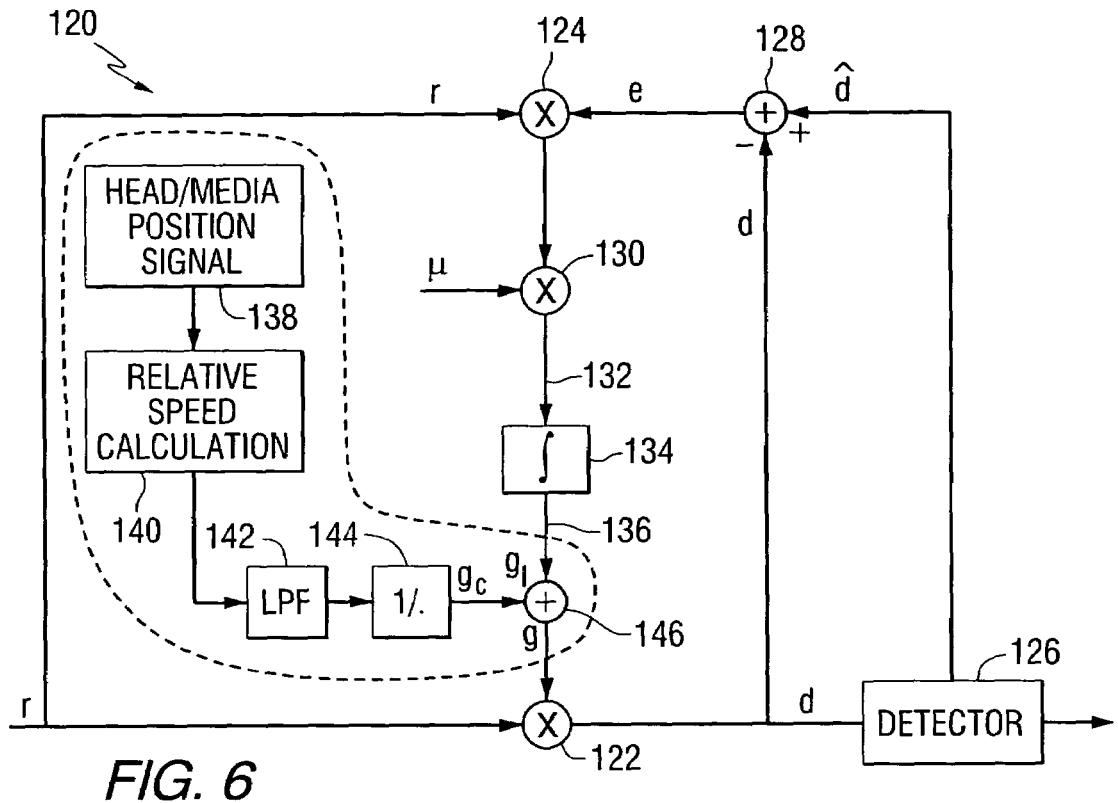
FIG. 6 is a schematic diagram of a channel state aided MMSE automatic gain control for probe storage devices.

FIG. 6 is a schematic diagram of an example AGC 120 of the present invention, where the channel gain observation $\hat{\lambda}$ is explicitly utilized by a MMSE based gain control circuit. A received signal r is input to multipliers 122 and 124. The output of multiplier 122 is the gain-controlled signal d. This signal is passed to a detector and feedback circuit 126, which produces the estimated ideal signal d̂. The estimated ideal signal d̂ and the signal d are combined in summation point 128 to produce an error signal e. The error signal e is multiplied by the received signal to produce a gradient estimate η. This gradient estimate is multiplied by an adaptation step size μ in multiplier 130 to produce a signal on line 132 that is integrated as shown in block 134 to produce a gain coefficient $g_l$ on line 136. In this example, a head/media position signal 138 is subjected to a relative speed calculation 140 to produce a (possibly) noisy observation that is filtered by a low-pass filter (LPF) 142 to reduce the noise. The filtered version of $\hat{\lambda}$ is subsequently inverted by inverter 144 to generate a gain multiplication factor $g_c$. This gain factor $g_c$ is then added to the MMSE AGC loop gain $g_l$ at summation point 146, arriving at a total gain $g=g_c+g_l$, which is used to multiply the received signal as illustrated by multiplier 122.

Figure 7:
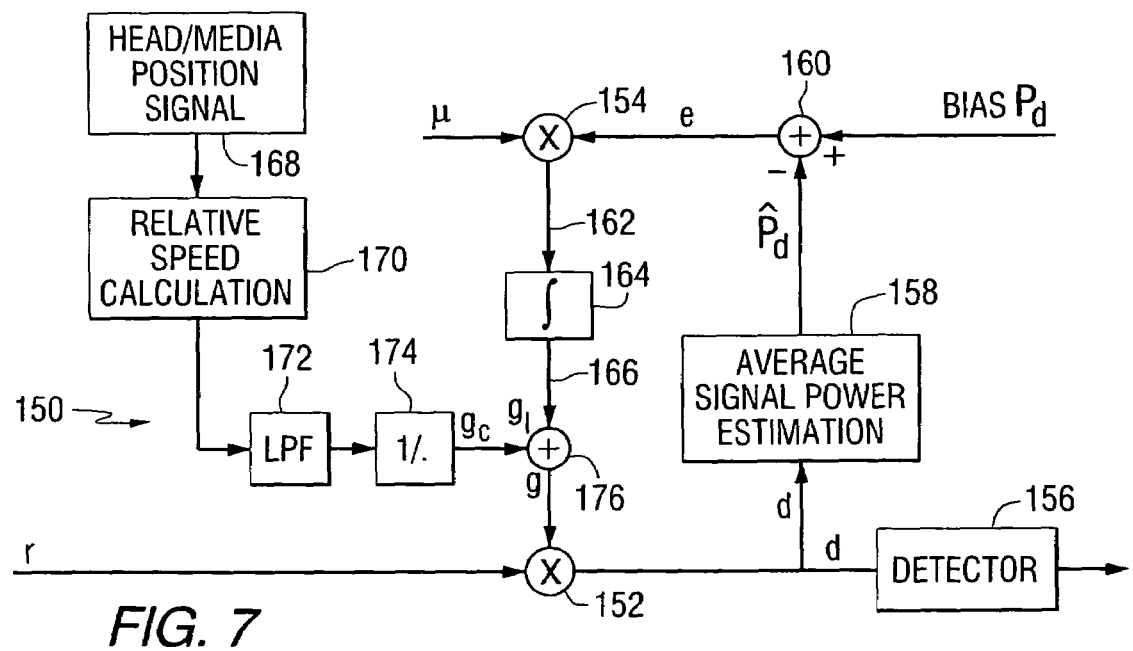
FIG. 7 is a schematic diagram of a channel state aided NDA MMSE automatic gain control for probe storage devices.

The AGC illustrated in FIG. 6 can be extended to non-data-aided automatic gain control in a straightforward fashion, an example of which is shown in FIG. 7. FIG. 7 is a schematic circuit of an example AGC 150 of the present invention, where the channel gain observation $\hat{\lambda}$ is explicitly utilized by a MMSE based gain control circuit. In non-data-aided automatic gain control systems, a desired signal power $P_d$ is often preset for optimal system performance. A received signal r is input to multiplier 152 and a step signal is input to multiplier 154. The output of multiplier 152 is the gain-controlled signal d. This signal is passed to a detector circuit 156. The gain-controlled signal d is processed as shown in block 158 to produce an average signal power estimation $\hat{P}_d$. The average signal power estimation $\hat{P}_d$ is subtracted from the desired signal power $P_d$ signal in summation point 160 to produce an error signal e. The error signal e is multiplied by the step signal to produce a signal on line 162. The signal on line 162 is integrated as shown in block 164 to produce a gain coefficient $g_l$ on line 166. A head/media position signal 168 is subjected to a relative speed calculation 170 to produce a (possibly) noisy observation that is filtered by a low-pass filter (LPF) 172 to reduce the noise. The filtered version of the observation is subsequently inverted by inverter 174 to generate a gain multiplication factor $g_c$. This gain factor $g_c$ is then added to the MMSE AGC loop gain $g_l$ at summation point 176, arriving at a total gain $g=g_c+g_l$, which is used to multiply the received signal as illustrated by multiplier 152.

In this scheme: the error signal e is generated by subtracting the estimated average signal power $\hat{P}_d$ from desired signal power $P_d$ and the gain adaptation is accomplished based on a gradient descent algorithm.

Figure 8:
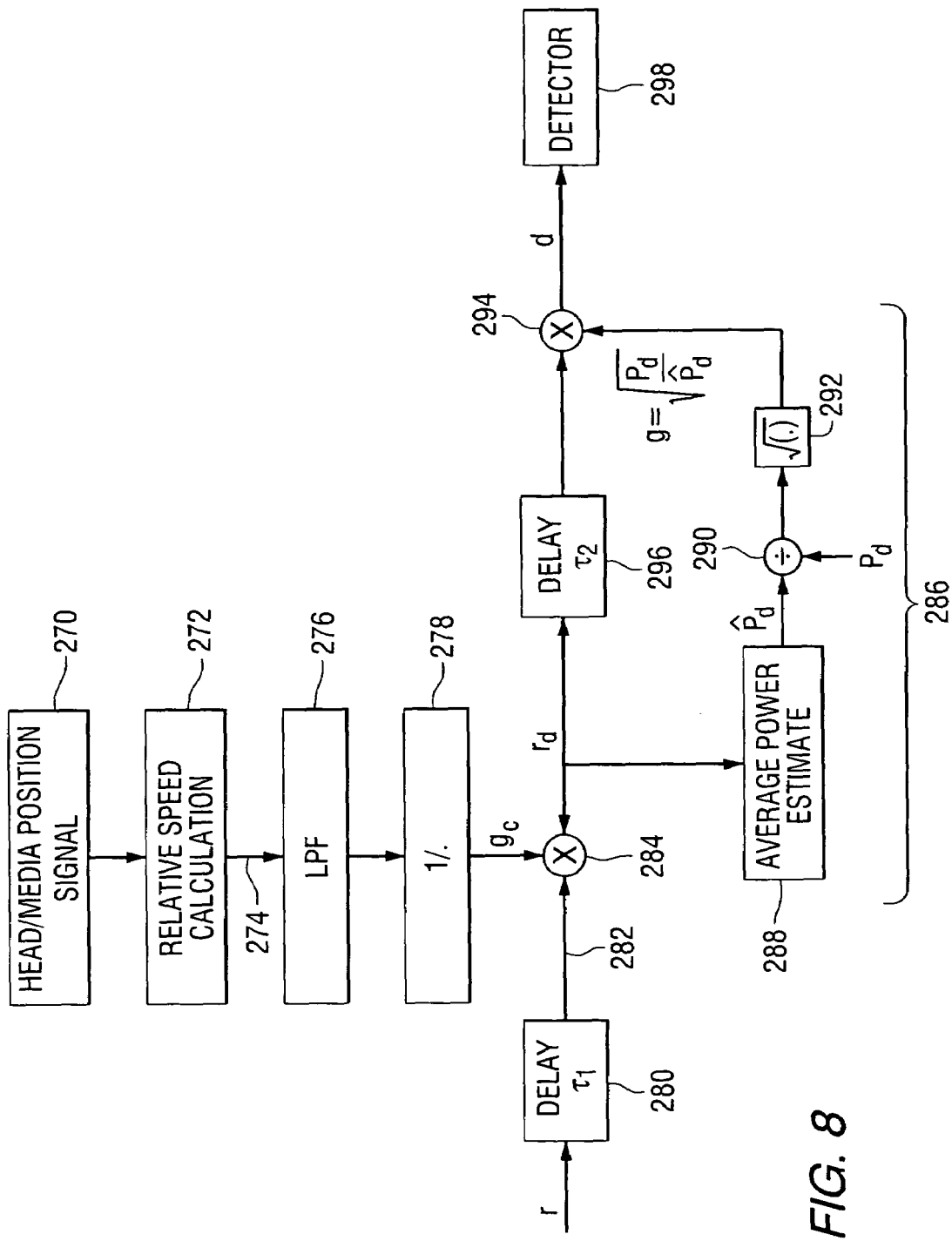
FIG. 8 is a schematic diagram of an open loop, non-data-aided AGC.

In addition, the invention can be extended to the case of an open loop non-data-aided automatic gain control circuit without technical complication. Such an example is illustrated in FIG. 8. In FIG. 8, a head/media position signal 270 is processed as shown in block 272 to produce a relative speed signal on line 274. The relative speed signal is low-pass filtered as shown in block 276 and inverted as shown in block 278 to produce a gain factor $g_c$. The readback signal r is first delayed by $\tau_l$, as illustrated by block 280, to compensate for the delay incurred in the control path (which is essentially due to the LPF). The delayed signal on line 282 is then amplified 284 by a gain $g_c$ calculated from the position signal, as explained above, to generate an intermediate signal $r_d$. This intermediate signal $r_d$ is then subjected to a second-stage gain control 286. At the second-stage gain control, the average signal power $\hat{P}_d$ of $r_d$ is estimated as shown in block 288. This estimated average signal power is compared to the desired signal power $P_d$ as shown by block 290, and the ratio between $\hat{P}_d$ and $P_d$ is obtained. The ratio is subsequently square-rooted (block 292) to obtain a second-stage gain factor of g. The intermediate signal $r_d$ is then multiplied by gain g, as shown by multiplier 294, after a delay 296 of $\tau_2$ introduced in the control path (primarily due to delay incurred in estimating the average power). The resulting signal d is passed to a detector 298.

Performance of the invention has been simulated to verify the effectiveness of the channel state aided AGC invention. The recording channel is assumed to have an error function transition response with only additive white Gaussian noise (AWGN) present in the system.

Figure 9B:
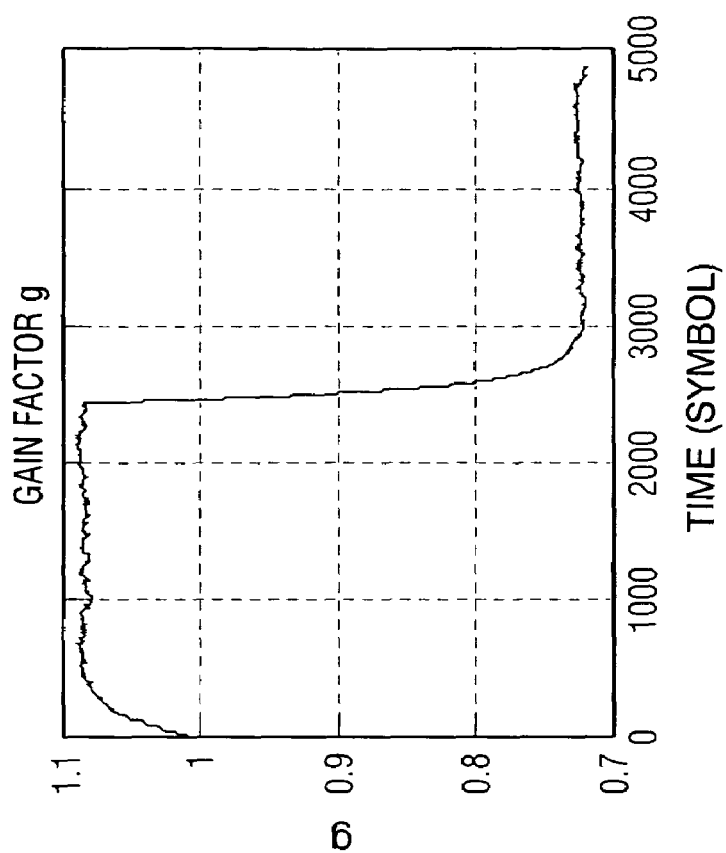
FIGS. 9a, 9b, 9c and 9d show simulation results for a conventional MMSE AGC.
Figure 9A:
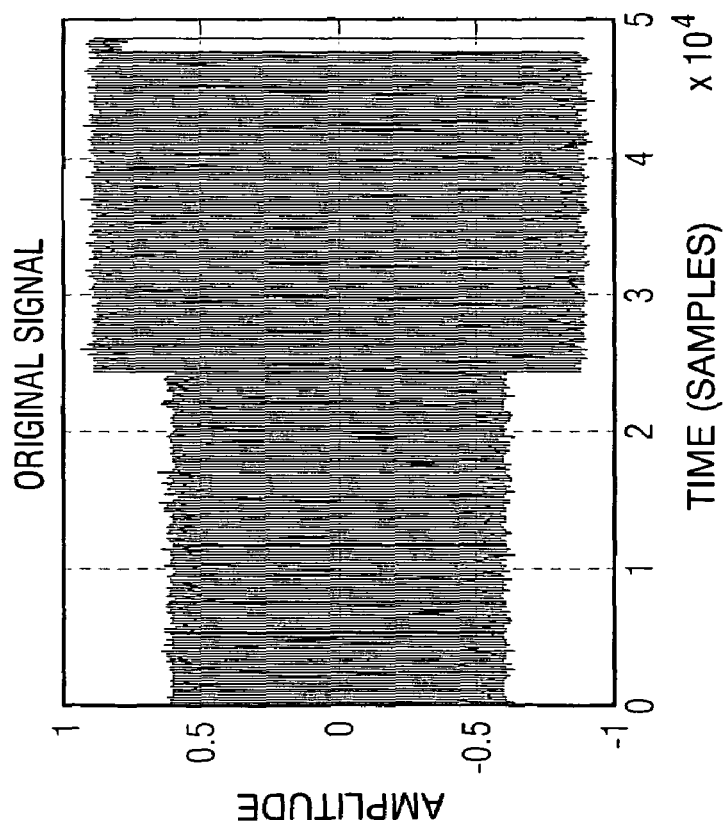
Figure 9D:
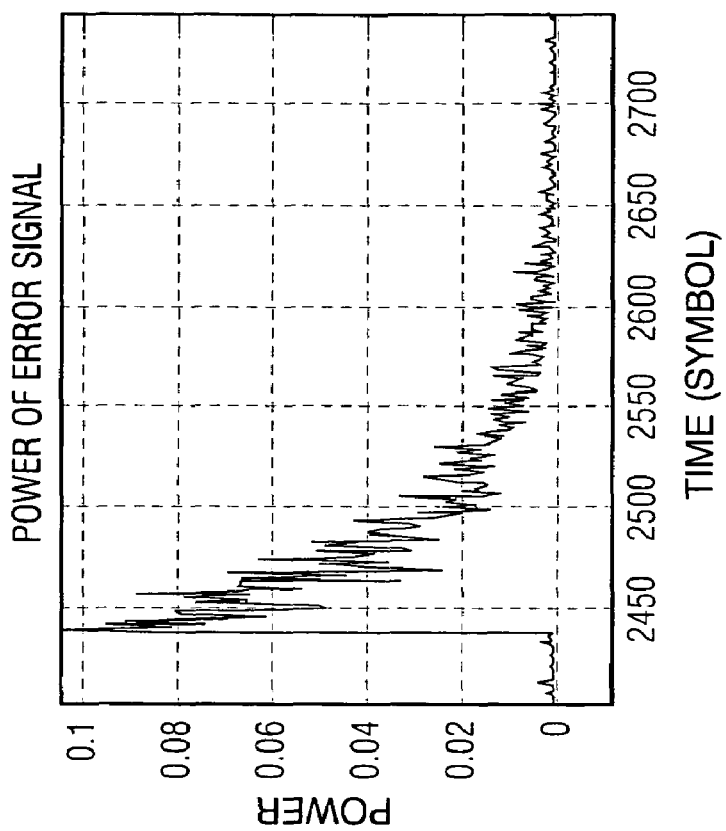
Figure 9C:
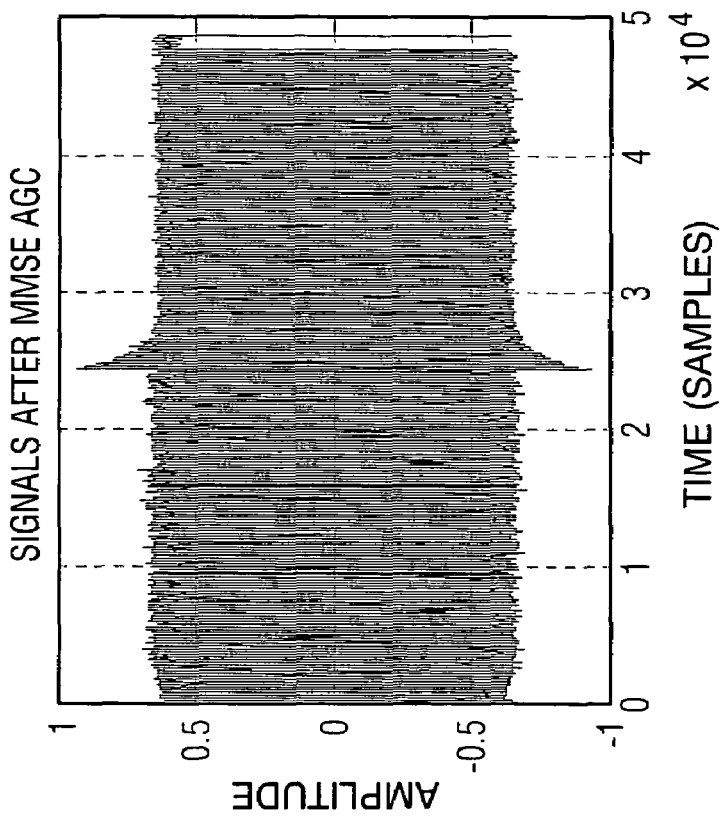
Figure 10B:
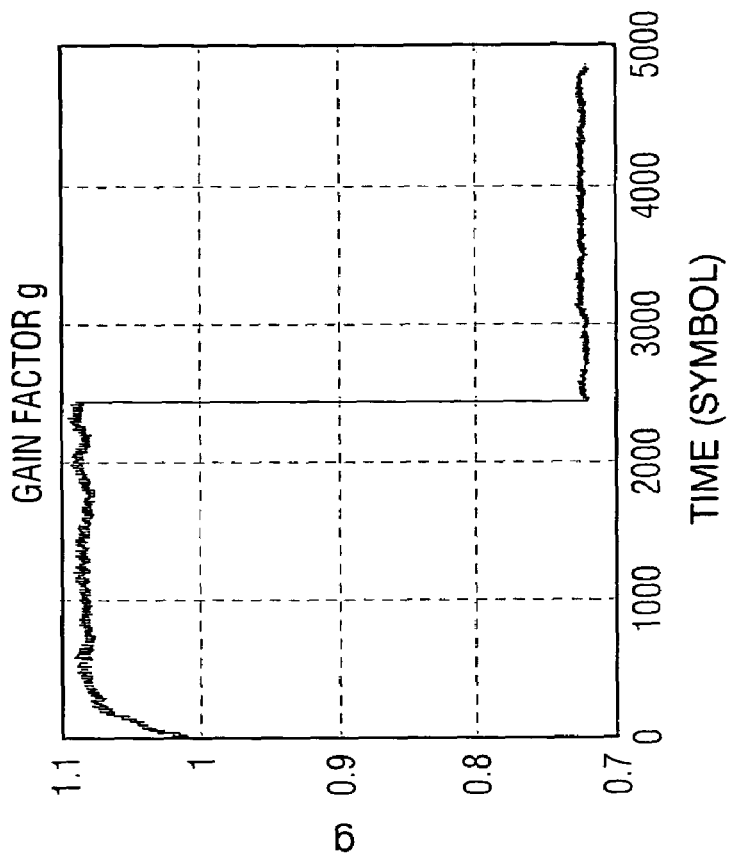
Figure 10A:
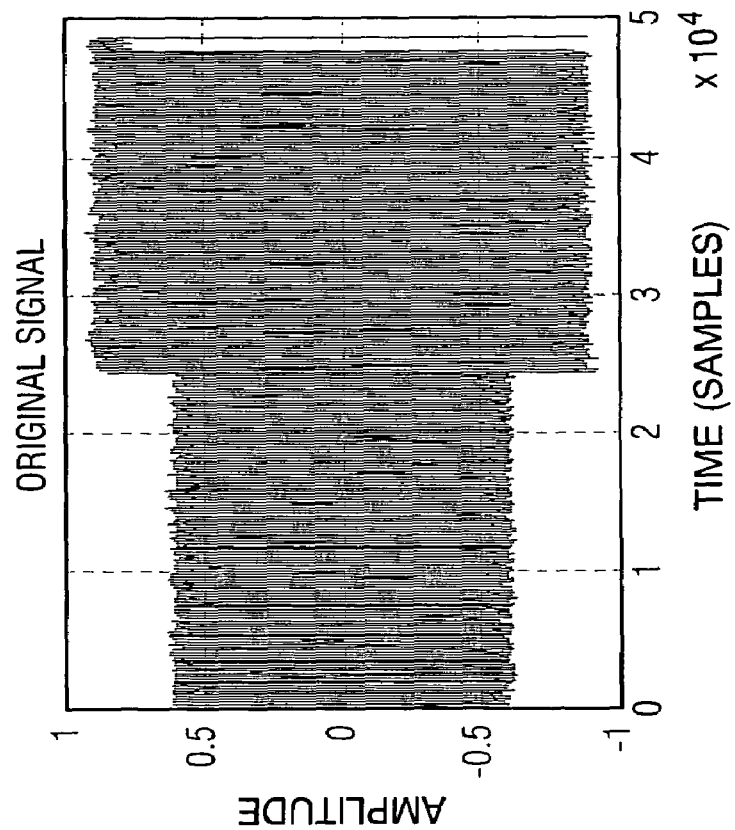

FIGS. 9a, 9b, 9c and 9d show simulation results for a conventional MMSE AGC. FIGS. 10a, 10b, 10c and 10d show simulation results for a channel state aided MMSE AGC. FIG. 9a and FIG. 10a show the original readback signal from the channel. The over-sampling ratio is 10. There is a sudden change of signal amplitude at time (in terms of signal samples) around 2048 (equivalent to the $2048^{th}$ symbol period) from approximately ±0.6 to ±0.9 for both signals due to head/media scan speed step-up. FIGS. 9a, 9b, 9c and 9d plot the simulation results of a data-aided MMSE AGC. Data detection is implemented via a simple threshold detector. The gain adaptation step size is set to 0.02. The gain factor g is shown in FIG. 9b. It is evident from this figure that the adaptation is successful, although it took more than a hundred symbol periods for the AGC loop to stabilize. The convergence process is also clear from FIGS. 9c and 9d, which depict the simulated AGC conditioned signal and error signal (with respect to the ideal signal levels) respectively.

FIGS. 10a, 10b, 10c and 10d show simulation results for the channel state aided MMSE AGC algorithm in accordance with this invention. The step-up in head/media scan speed is assumed to be observed by the read channel via a noisy device with additive white Gaussian noise (AWGN) corruption (and a standard deviation of 0.002). By employing the scheme shown in FIG. 6 with a first order low-pass filter having a transfer function of 0.8/(1−0.2D), where D is the delay operator, the gain control loop keeps up with the sudden change of signal amplitude very well. The delay operator D delays the incoming signal by a unit time (determined by the sampling rate) and is often used to construct a digital filter.

Figure 11:
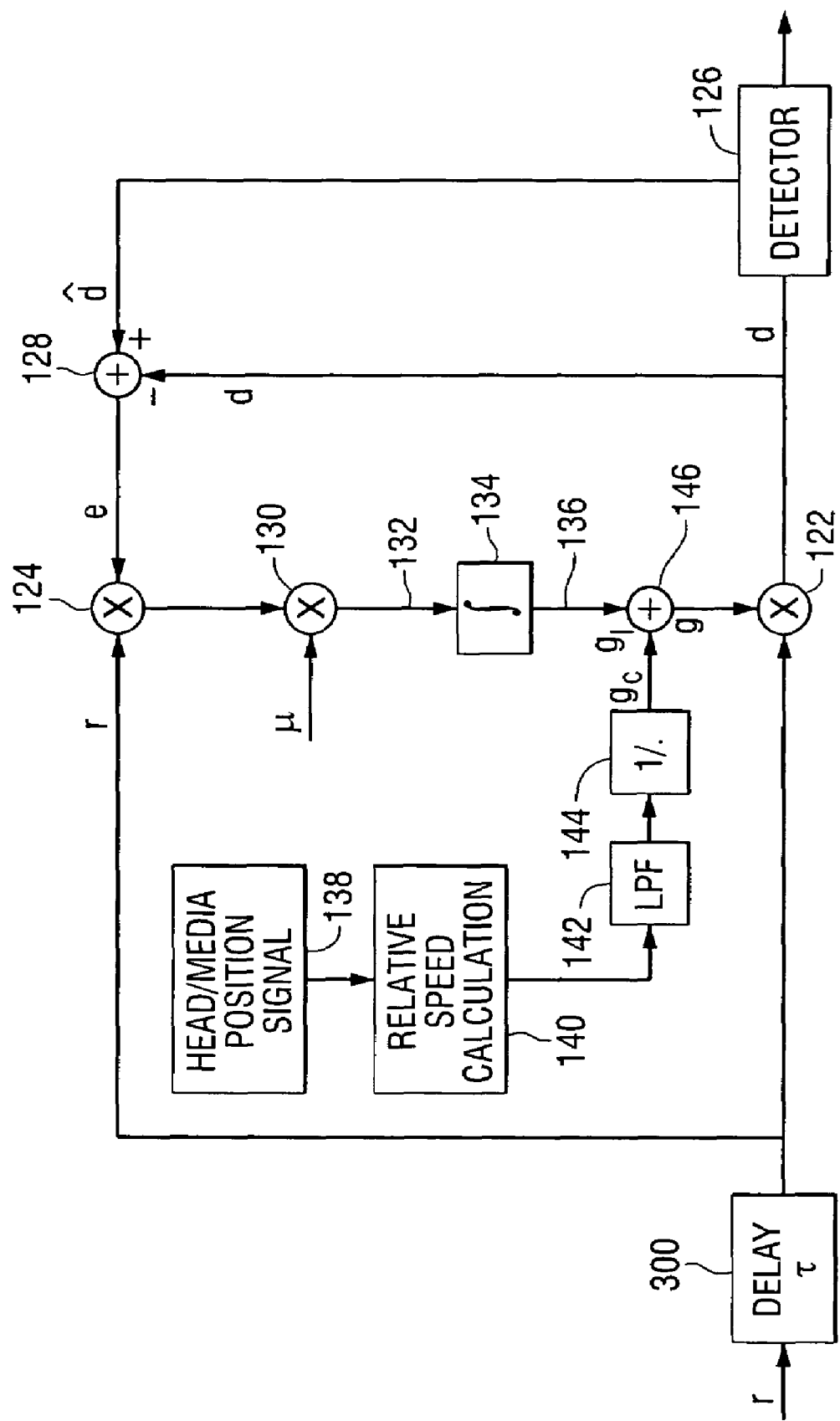
FIG. 11 is a schematic diagram of a channel state aided MMSE automatic gain control for probe storage devices.

This is particularly evident from FIGS. 10c and 10d where the AGC conditioned signal and error signal power trajectory are shown. In contrast to FIGS. 9c and 9d, the convergence of the gain to the desired value is much faster for the channel state aided scheme. The spike in the error power trajectory is due to delays between the channel state change and gain update of the variable gain amplifier (VGA), as well as the low-pass filtering effect of the position signal. Such spikes can be mitigated or even completely eliminated by inserting a proper delay in the signal path to compensate for the delay incurred in the control path, as shown in FIG. 11. FIG. 11 is the same as FIG. 6, except for the addition of a delay in the received signal path as illustrated by block 300.

Figure 12A:
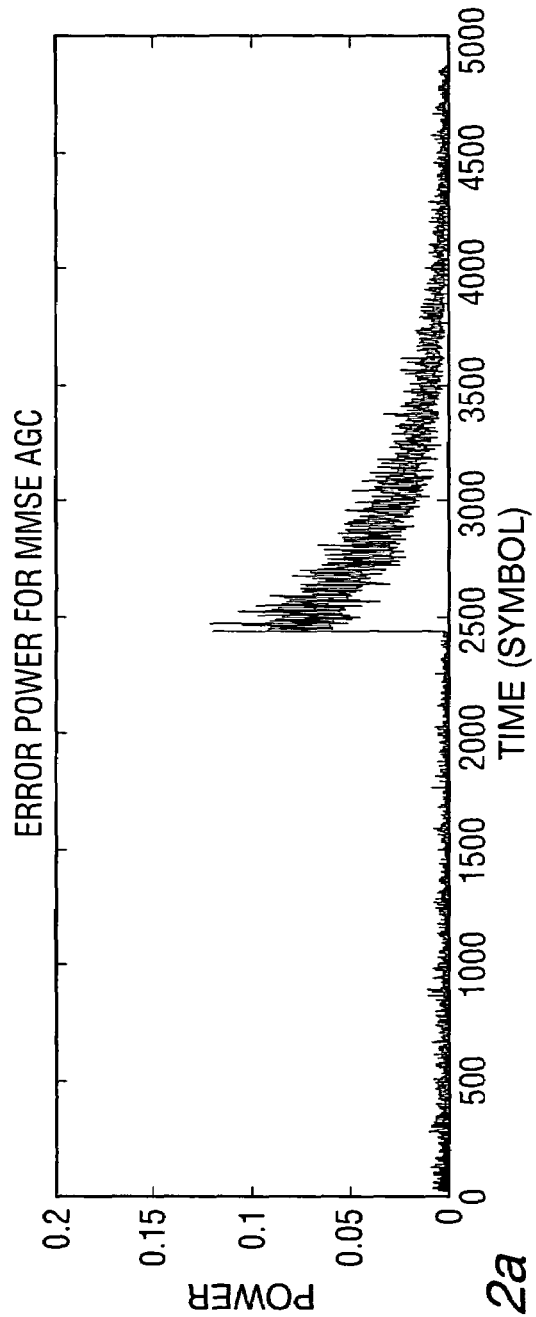
FIG. 12a is a plot of the error power of a conventional MMSE AGC.
Figure 12B:
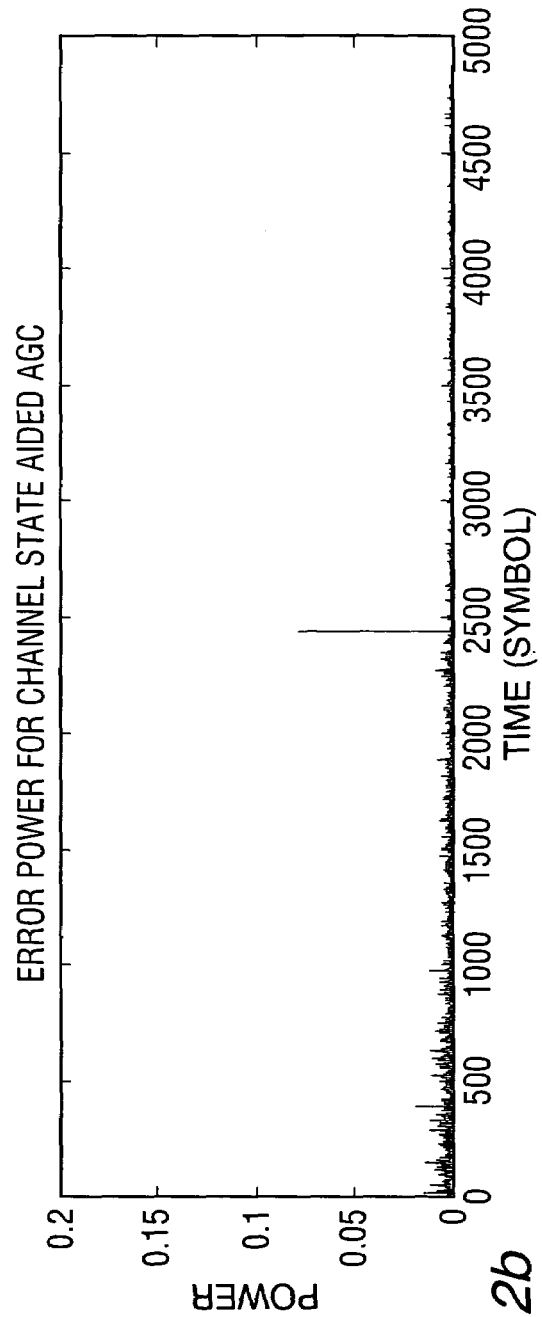
FIG. 12b is a plot of the error power of a channel state aided AGC.

As discussed above, if the majority of the variation in channel gain can be captured by the available channel state information, the loop bandwidth can be further narrowed for the channel state AGC scheme in order to reduce mean-square error. In comparison, narrowing the loop bandwidth results in significantly slower convergence for conventional data-aided AGC. FIGS. 12a and 12b show the simulated error power trajectory of a conventional MMSE AGC and a channel state aided MMSE AGC, respectively, when the adaptation step size are set to 0.002. The slower convergence of the conventional MMSE algorithm is evident from FIG. 12a.

A stability and convergence analysis of the CSA MMSE AGC algorithm is described next. In particular, the stability and convergence behavior of the CSA AGC algorithm have been investigated based on the MMSE feedback loop shown in FIG. 5.

Assume the channel state information available to the receiver is incomplete. In other words, if the actual channel symbol response can be characterized by $$p(t)=(\lambda_c+\lambda_l)h(t) \qquad (3)$$

where $\lambda_c$ and $\lambda_l$ can be time varying, and h(t) is the target channel response of the AGC algorithm, then the available channel state information is a noisy observation of $\lambda_c$. This analysis is restricted to non-degenerating cases where $A_c \neq 0$. The noisy observation of $\lambda_c$ is low-pass filtered and inverted to generate an estimate of $\lambda_c$ denoted by $\hat{\lambda}_c$. The estimate at time k is denoted by $\hat{\lambda}_c(k)$ and its inverse by $$\hat{g}_c(k) \triangleq \frac{1}{\hat{\lambda}_c(k)}.$$

Hence, $$\hat{g}_c(k)=g_c(k)+u_c(k) \qquad (4)$$

where $$\hat{g}_c(k) = \frac{1}{\hat{\lambda}_c(k)} \text{ and } u_c(k),$$

without loss of generality, is assumed to be a zero-mean random variable. In the following stability analysis, assume that $$\lim_{k \to \infty} E\{u_c(k)\} = 0 \qquad (5)$$

if $\lambda_c$ is constant or slowly time varying.

FIG. 5 reveals that $$r(k)=(\lambda_c+\lambda_l)d(k)+n(k) \qquad (6)$$

and $$d(k)=(g_c(k-1)+g_l(k-1))r(k) \qquad (7)$$

where, n(k) is the channel noise, assumed to be zero-mean.

Now, the gain coefficient $g_l(k)$ is updated with $$g_l(k)=g_l(k-1)+\mu r(k) \cdot e(k)=g_l(k-1)+\mu r(k) \cdot [\hat{d}(k)-d(k)]. \qquad (8)$$

Substituting Eqs. (6) and (7) into (8) gives $$g_c(k)=g_l(k-1)+\mu[\hat{d}(k)^2\lambda(1-g(k-1)\lambda)+n(k)(1-g(k-1)\lambda)$$
$$\hat{d}(k)-\lambda\hat{d}(k)g(k-1)n(k)-g(k-1)n(k)^2]. \qquad (9)$$

Realizing that $g(k)=g_l(k)+g_c(k)$ and taking the expectation on both sides, then $$E\{g_l(k)\} = E\{g_l(k-1)\}(1-\mu P_d\lambda^2-\mu P_n)+\mu P_d\lambda- \qquad (10)$$
$$\mu(P_d\lambda^2+P_n)E\{g_c(k-1)\}$$
$$= E\{g_l(k-1)(1-\mu P_r)+\mu P_d\lambda-\mu P_r E\{g_c(k-1)\}.$$

In Eq. (10), the noise n(k) is assumed to be zero-mean and uncorrelated with the signal $\hat{d}(k)$. In addition, $$P_d \triangleq E\{\hat{d}(k)^2\}, P_n \triangleq E\{n(k)^2\} \text{ and } P_r \triangleq E\{r(k)^2\},$$

have been defined to represent the desired mean signal power, channel noise power, and received signal power, respectively.

In order for the algorithm to be stable, the first term in the right-hand side of Eq. (10) should decrease in magnitude as a function of time. This yields $$\mu(P_d\lambda^2+P_n)=\mu P_r<2. \qquad (11)$$

The steady-state tracking rate thus amounts to $20 \log_{10}(1-\mu P_r)$ dB/iteration, which indicates a loop gain of $$K_r \approx \mu P_r. \qquad (12)$$

Furthermore, from Eq. (10), the steady-state solution of $g_l$ is given by $$\lim_{k \to \infty} E\{g_l(k)\} = \frac{P_d\lambda-(P_d\lambda^2+P_n)/\lambda_c}{P_d\lambda^2+P_n} = \frac{P_d\lambda}{P_r}-\frac{1}{\lambda_c}. \qquad (13)$$

From the above analysis, it is observed that for the feedback loop itself, the stability and convergence rate of the CSA AGC are similar to the conventional MMSE AGC. However, note that the feedback loop is essentially tracking the residual channel gain fluctuation $\lambda_l$, instead of the total gain $\lambda_c+\lambda_l$ as in the case for a conventional MMSE AGC architecture. The adaptation time constant $\tau$ of the CSA AGC is bounded above by $$\tau \leq \tau_l + \tau_c \quad (14)$$

where $\tau_l$ and $\tau_c$ denote the time constant of the MMSE feedback loop and LPF of the channel state information branch as indicated in FIG. 5, respectively. In the simulation, $\tau_c \ll 1$ while $\tau_l = 1/K_t \gg 1$. Hence, $\tau$ can be approximated by $$\tau \approx \tau_l. \quad (15)$$

When $\lambda_c$ captures the majority of the channel gain fluctuation, it is not difficult to see that the channel state aided AGC converges much faster than the conventional MMSE AGC, since with similar adaptation time constants, the conventional MMSE AGC needs to track changes in $\lambda_l$ as well as $\lambda_c$, while the CSA AGC only tracks $\lambda_l$.

For a mean-square error analysis, start with the conventional MMSE AGC algorithm illustrated in FIG. 2. The variance of error signal e is $$E\{e^2\} = E\left\{(\hat{d}-d)^2\right\} \quad (16)$$
$$= E\left\{(\hat{d}-g\cdot r)^2\right\}.$$

Substituting the steady solution of $\tilde{g} = \lambda P_d/P_r$ into Eq. (16), the error variance can be simplified to $$\varepsilon_{\min} \triangleq E\{e^2\}|_{g=\tilde{g}} = \frac{P_d P_n}{P_r}, \quad (17)$$

which is the minimum mean-square error $\epsilon_{min}$ the loop can achieve. Subsequently, it maintains that $$E\{\eta^2\} = E\left\{r^2(\hat{d}-d)^2\right\} \quad (18)$$
$$= E\{r^2\}E\left\{(\hat{d}-d)^2\right\}$$
$$= P_r E\{e^2\}$$

where the loop eliminates any correlation between r and e.

Figure 13A:
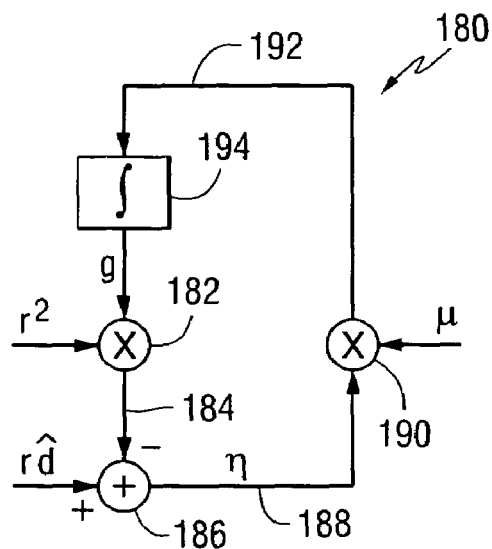
FIG. 13a is a simplified model of a MMSE AGC.

FIG. 13a is a simplified model 180 of a conventional MMSE AGC. The signal $r^2$ is multiplied by the gain g in multiplier 182. This results in a signal on line 184 that is subtracted from signal rd̂ at summation point 186 to produce a signal on line 188 that is multiplied by the step μ in multiplier 190. The resulting signal on line 192 is integrated as shown by block 194 to produce the gain signal g.

Figure 13B:
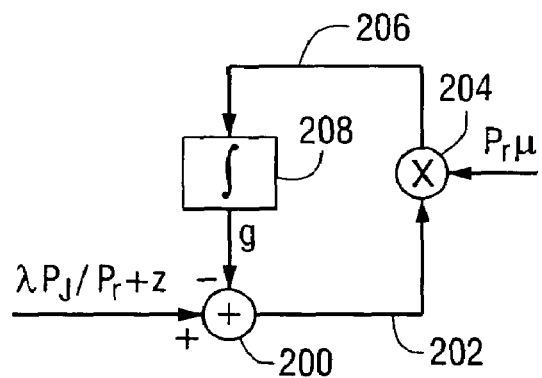
FIG. 13b is a further simplified model of a MMSE AGC with gain mismatch explicitly shown.

FIG. 13b is a further simplified model of a conventional MMSE AGC with gain mismatch explicitly shown. In FIG. 13b, the gain g is subtracted from signal $$\frac{\lambda P_d}{P_r} + z$$

in summation point 200 to produce a signal on line 202 that is multiplied by $P_r\mu$ in multiplier 204 to produce a signal on line 206 that is integrated as shown by block 208 to produce the gain g.

Now since $$\eta = r(\hat{d}-gr) = r\hat{d} - gr^2, \quad (19)$$

FIG. 2 can be simplified to the model illustrated in FIG. 13a. If $r^2$ and rd̂ are to be replaced by their respective deterministic averages $P_r$ and $\lambda P_d$, the variation due to noise can be captured by a single random variable z as shown in FIG. 13b, where a common factor of $P_r$ is shifted out of the loop. It is not difficult to show that the variance of z becomes $$\sigma_z^2 = E\left\{\left(\frac{\eta}{P_r}\right)^2\right\} = \frac{E\{r^2\}E\{e^2\}}{P_r^2} \approx \frac{\varepsilon_{\min}}{P_r} = \frac{P_d P_n}{P_r^2}. \quad (20)$$

Consider the loop transfer function from z to g. Then the Z-transform is given by $$G_c(z) = \frac{K_t}{K_t + z - 1}, \quad (21)$$

where $K_t = \mu P_r$. The gain mismatch is $$\sigma_v^2 = \sigma_z^2 B_l \quad (22)$$

where $$B_l = \int_{-0.5}^{0.5} |G_c(e^{j2\pi w})|^2 dw = \frac{K_t}{2-K_t}. \quad (23)$$

It can be seen that for $K_t \ll 1$, the mean-square error of the gain g is proportional to the adaptation step size μ and noise power $P_n$.

Figure 14A:
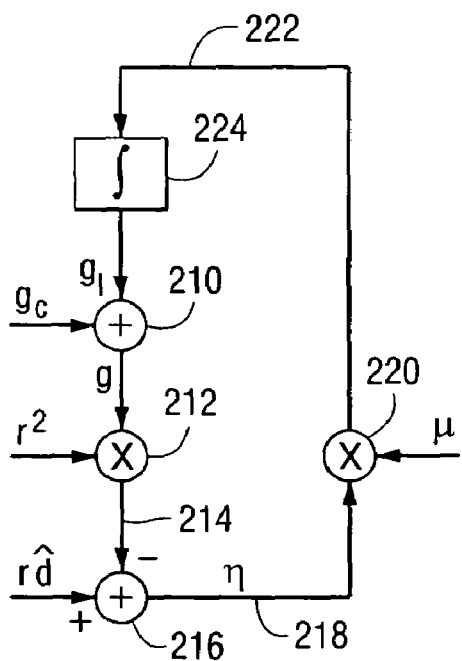
FIG. 14a is a simplified model of a channel state aided (CSA) MMSE AGC.

For the channel state aided MMSE AGC, also consider the noise introduced via the channel state information. The simplified loop model for FIG. 6 is illustrated in FIG. 14a. The signal $g_c$ is added to the loop gain $g_l$ in summation point 210 to produce the gain signal g. The signal $r^2$ is multiplied by the gain g in multiplier 212. This results in a signal on line 214 that is subtracted from signal rd̂ at summation point 216 to produce a signal on line 218 that is multiplied by the step μ by multiplier 220. The resulting signal on line 222 is integrated as shown by block 224 to produce the gain signal $g_l$.

Figure 14B:
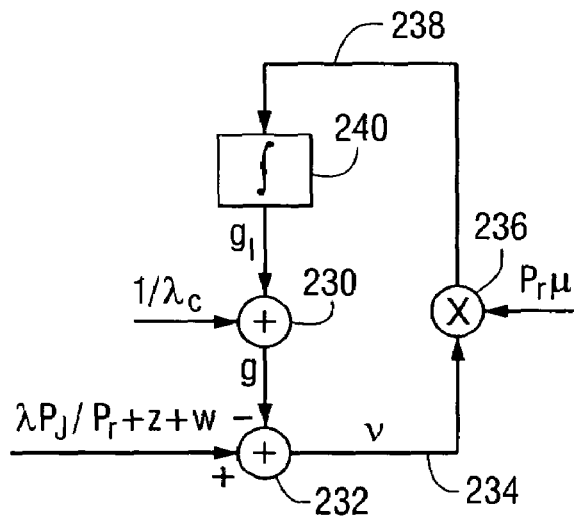
FIG. 14b is a further simplified model of a channel state aided (CSA) MMSE AGC with gain mismatch explicitly shown.

In FIG. 14b, the loop gain $g_l$ is added to the reciprocal of the channel gain $\lambda_c$ in summation point 230 to produce the gain g. The gain g is subtracted from signal $$\frac{\lambda P_d}{P_r} + z + w$$

in summation point 232 to produce a signal on line 234 that is multiplied by $P_r\mu$ in multiplier 236 to produce a signal on line 238 that is integrated as shown by block 240 to produce the loop gain $g_l$.

From Eq. (10), the steady-state solution of $g_l$ amounts to $$E\{g_l\} = \frac{P_d \lambda}{P_r} - \frac{1}{\lambda_c}. \quad (24)$$

If the channel state observation is unbiased, i.e., $E\{g_c\}=1/\lambda_c$, $g_o$ can be defined as $$g_o \stackrel{\Delta}{=} E\{g\} = E\{g_l\} + E\{g_c\} = \frac{P_d(\lambda_l + \lambda_c)}{P_r}. \quad (25)$$

This leads to the error variance $$\varepsilon_{\min} = E\{e^2\}|_{g=g_o} = E\{(\hat{d}-d)^2\} = \frac{P_d P_n}{P_r} \quad (26)$$

and $$E\{\eta^2\}|_{g=g_o} = P_d P_n. \quad (27)$$

Similar to FIG. 13b, the fluctuations due to noise around the ideal value of $g_o$ can be captured by z, while the variations due to the observation noise of $g_c$ can be characterized by w, which is defined as the channel state observation noise. From Eq. (27), the variance of z is $$E\{z^2\} = E\{(\eta/P_r)^2\} = \frac{P_d P_n}{P_r^2}, \quad (28)$$

and the variance of w is simply the observation error power $E\{u_c^2\}$. Then the loop mean-square error is $$E\{v^2\} = \{\varepsilon_{\min}/P_r + P_{nc}\}B_l \quad (29)$$

where $B_l$ is defined in Eq. (23) and $P_{nc} = E\{u_c^2\}$.

In practice, when the adaptation step size μ is small, it holds that $B_l \approx \mu P_r/2$. The CSA MMSE AGC algorithm achieves smaller error variance if $$\frac{\left(\frac{P_d P_n}{P_r^2} + P_{nc}\right)\mu_1 P_r}{2} \leq \frac{\frac{P_d P_n}{P_r^2}\mu_2 P_r}{2} \quad (30)$$

where $\mu_1$ and $\mu_2$ are the step size of the CSA MMSE AGC and the conventional MMSE AGC loop, respectively. Consequently, if it holds that $$P_{nc} \leq \left(\frac{\mu_2}{\mu_1} - 1\right)\frac{P_d P_n}{P_r^2} \quad (31)$$

then the channel state AGC algorithm can achieve less tracking error (in the stable state) than the conventional MMSE AGC algorithm. This is possible in the case when the majority of the channel gain variations have been captured by $\lambda_c$. Hence, $\mu_1$ can be set much smaller than $\mu_2$ as only residual variations in $\lambda_l$ need to be tracked for the CSA AGC algorithm, in contrast to $\lambda_l + \lambda_c$ for the conventional AGC.

It should now be apparent that compared to conventional AGC methods, this invention can achieve faster gain acquisition as well as potentially less mean-square tracking error. As an application example, the method is applied to probe storage devices for automatic gain control, where channel state information such as media/head relative speed is known to the read channel.

Figure 15:
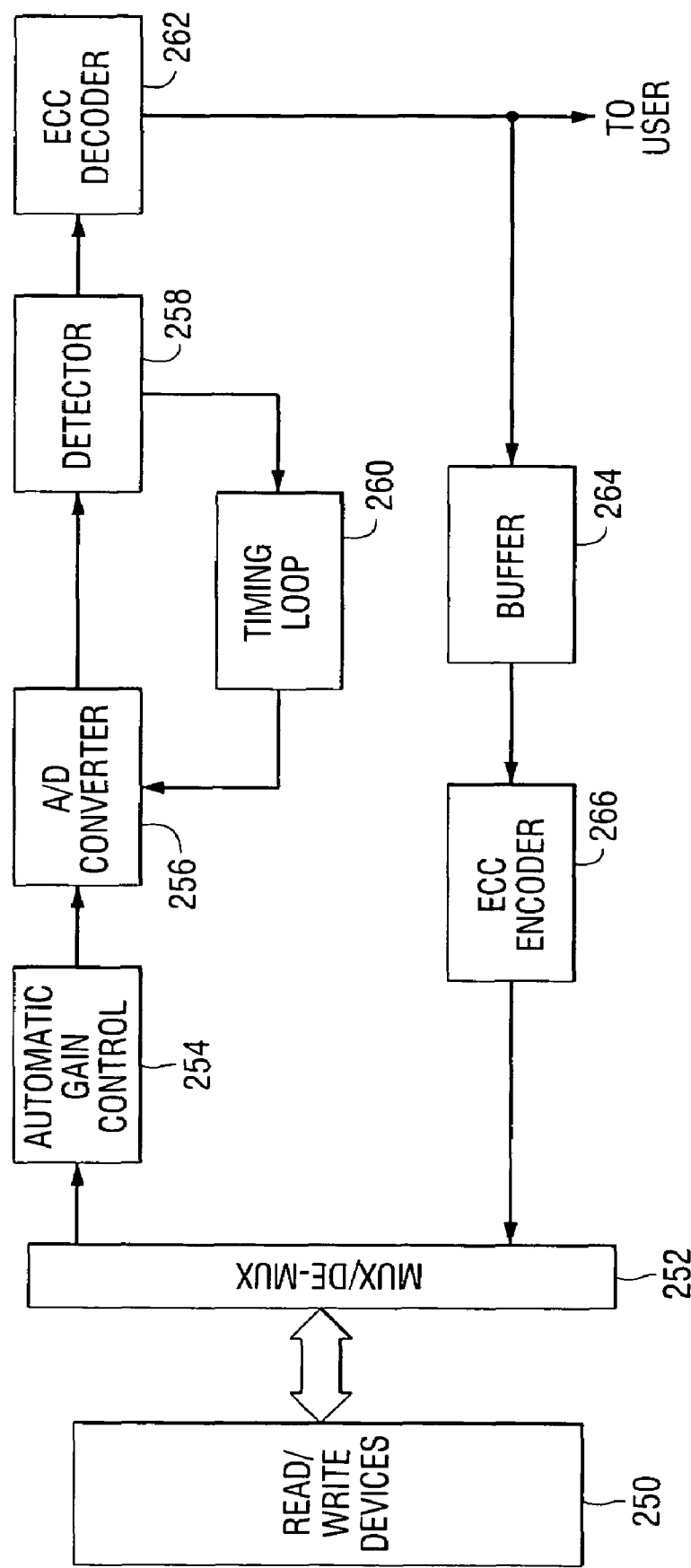
FIG. 15 is a block diagram of a data storage system that includes an AGC in accordance with the invention.

FIG. 15 is a block diagram of a system that includes a ferroelectric storage apparatus shown as read/write devices 250. Data that is read from these devices is demultiplexed as illustrated by block 252 and passed through an automatic gain control 254 constructed in accordance with this invention. The output of the automatic gain control is converted to a digital signal by an analog to digital converter 256 and detected by detector 258. A timing loop 260 gains access to the detected data from detector 258 and calculates the sampling phase, which is supplied to the analog to digital converter 256. In an alternate embodiment, the data sequence is supplied with known data. Both inductive and deductive timing recovery methods can be applied for timing recovery. In other words, the timing loop 260 can also operate without knowing the detected data sequence. The detected signals are decoded by an error correction code decoder 262 and sent to the user. Examples of error correction codes include but are not limited to Reed-Solomon codes, Reed-Muller codes, or more generally BCH codes. The decoded signals are also sent to a buffer 264 and subject to error correction encoding as shown by block 266 prior to being rewritten to the storage medium. In an alternate embodiment, the error correction encoding can be intermittently skipped, depending on the raw bit error rate of the channel. In other words, the data can be written back to the media without going through the error correction decoding and encoding intermittently.

In this description, the discussion has been focused on data-aided and closed-loop AGCs for ease of presentation, although the presented method can be extended to the non-data-aided and/or open loop cases in a straightforward manner. An open loop AGC utilizing channel state information is shown in FIG. 8.

While the invention has been described in terms of several examples, it will be apparent to those skilled in the art that various changes can be made to the disclosed examples without departing from the scope of the invention as set forth in the following claims.

What is claimed is:

1. An apparatus comprising:
   a sensor for measuring a channel property that affects the amplitude of a signal of interest;
   a processor for converting the measured channel property to a channel gain control signal;
   an amplifier for amplifying the signal of interest in response to the channel gain control signal; and
   wherein the channel gain control signal is generated from a channel state signal that is not derived from the signal of interest.

2. The apparatus of claim 1, wherein the channel property comprises:
   a head/media position signal.

3. The apparatus of claim 1, further comprising:
   a second-stage variable gain amplifier for amplifying the signal of interest in response to a loop gain control signal.

4. An apparatus comprising:
   a first circuit for producing a channel gain signal;
   a detector for producing an estimated ideal signal;
   an amplifier for amplifying a signal of interest in response to a gain control signal to produce a gain-controlled signal;
   a component for combining the gain-controlled signal and the estimated ideal signal to produce an error signal; and
   a second circuit for processing the error signal to produce a loop gain signal;
   wherein the gain control signal comprises a combination of the loop gain signal and the channel gain signal.

5. The apparatus of claim 4, wherein the component for combining the gain-controlled signal and the estimated ideal signal to produce an error signal comprises a summation point.

6. The apparatus of claim 4, wherein the second circuit comprises a second amplifier for multiplying the error signal by the signal of interest to produce an intermediate variable signal, and a third amplifier for multiplying the intermediate variable signal by an adaptation constant.

7. An apparatus comprising:
a first circuit for producing a channel gain signal;
a detector for producing an estimated ideal signal;
an amplifier for amplifying a signal of interest in response to a gain control signal to produce a gain-controlled signal;
a processor for determining the average signal power of the gain-controlled signal;
a component for combining the average signal power and a desired signal power to produce an error signal; and
a second circuit for processing the error signal to produce the loop gain signal;
wherein the gain control signal comprises a combination of the loop gain signal and the channel gain signal.

8. The apparatus of claim 7, wherein the component for combining the average signal power and a desired signal power to produce an error signal comprises a summation point.

9. The apparatus of claim 7, wherein the second circuit comprises a second amplifier for multiplying the error signal by the signal of interest to produce an intermediate variable signal, and a third amplifier for multiplying the intermediate variable signal by an adaptation constant.

10. A method comprising:
measuring a channel property that affects the amplitude of the signal of interest;
converting the measured channel property to the channel gain control signal; and
amplifying a signal of interest in response to the channel gain control signal;
wherein the channel gain control signal is generated from a channel state signal that is not derived from the signal of interest.

11. The method of claim 10, wherein the channel property comprises:
a head/media position.

12. The method of claim 10, further comprising:
amplifying the signal of interest in response to a loop gain control signal using a second-stage amplifier.

13. A method comprising:
producing a loop gain signal;
producing a head/media position signal;
producing a channel gain signal in response to the head/media position signal; and
amplifying a signal of interest in response to a gain control signal;
wherein the gain control signal comprises a combination of the loop gain signal and the channel gain signal.

14. A method comprising:
producing a loop gain signal;
producing a channel gain signal;
amplifying a signal of interest in response to a gain control signal to produce a gain-controlled signal;
producing an estimated ideal signal;
combining the gain-controlled signal and the estimated ideal signal to produce an error signal; and
processing the error signal to produce the loop gain signal;
wherein the gain control signal comprises a combination of the loop gain signal and the channel gain signal.

15. A method comprising:
producing a loop gain signal;
producing a channel gain signal;
amplifying a signal of interest in response to a gain control signal to produce a gain-controlled signal;
determining the average signal power of the gain-controlled signal;
combining the average signal power and a desired signal power to produce an error signal; and
processing the error signal to produce the loop gain signal;
wherein the gain control signal comprises a combination of the loop gain signal and the channel gain signal.

16. The apparatus of claim 1, further comprising:
a ferroelectric storage medium; and
an array of probes for reading data from the ferroelectric storage medium;
wherein the signal of interest comprises a read signal from the probes.

* * * * *